(12) United States Patent
Hsieh et al.

(10) Patent No.: US 11,317,220 B2
(45) Date of Patent: Apr. 26, 2022

(54) STRUCTURE OF MICRO-ELECTRO-MECHANICAL-SYSTEM MICROPHONE

(71) Applicant: Solid State System Co., Ltd., Hsinchu (TW)

(72) Inventors: Tsung-Min Hsieh, New Taipei (TW); Cheng-Wei Tsai, Taichung (TW); Chien-Hsing Lee, Hsinchu County (TW)

(73) Assignee: Solid State System Co., Ltd., Hsinchu (TW)

( * ) Notice: Subject to any disclaimer, the term of this patent is extended or adjusted under 35 U.S.C. 154(b) by 254 days.

(21) Appl. No.: 16/719,941

(22) Filed: Dec. 18, 2019

(65) Prior Publication Data
US 2021/0195340 A1 Jun. 24, 2021

(51) Int. Cl.
*H04R 19/00* (2006.01)
*H04R 19/04* (2006.01)
(Continued)

(52) U.S. Cl.
CPC ........... *H04R 19/04* (2013.01); *B81B 3/0021* (2013.01); *B81C 1/00158* (2013.01);
(Continued)

(58) Field of Classification Search
CPC .......... H04R 19/04; H04R 1/222; H04R 7/08; H04R 7/18; H04R 19/005;
(Continued)

(56) References Cited

U.S. PATENT DOCUMENTS 9,002,037 B2 4/2015 Dehe et al.
9,487,389 B2 11/2016 Jenkins et al.
(Continued)

FOREIGN PATENT DOCUMENTS

CN 101580222 11/2009
CN 103716743 4/2014
(Continued)

OTHER PUBLICATIONS

Office Action of Taiwan Counterpart Application, dated Mar. 29, 2021, pp. 1-4.
(Continued)

*Primary Examiner* — Matthew A Eason
(74) *Attorney, Agent, or Firm* — JCIPRNET (57) ABSTRACT

In an embodiment, the invention provides a structure of MEMS microphone includes a substrate of semiconductor, having a first opening in the substrate. A dielectric layer is disposed on the substrate, having a dielectric opening. A diaphragm is within the dielectric opening and held by the dielectric layer at a peripheral region, wherein the diaphragm has a diaphragm opening. A back-plate is disposed on the dielectric layer, over the diaphragm. A protruding structure is disposed on the back-plate, protruding toward the diaphragm. At least one air valve plate is affixed on an end of the protruding structure within the diaphragm opening of the diaphragm. The air valve plate is activated when suffering an air flow with a pressure.

17 Claims, 6 Drawing Sheets

(51) Int. Cl.
*H04R 1/22* (2006.01)
*B81B 3/00* (2006.01)
*B81C 1/00* (2006.01)
*H04R 7/18* (2006.01)
*H04R 7/08* (2006.01)

(52) U.S. Cl.
CPC ............... *H04R 1/222* (2013.01); *H04R 7/08* (2013.01); *H04R 7/18* (2013.01); *H04R 19/005* (2013.01); *B81B 2201/0257* (2013.01); *H04R 2201/003* (2013.01)

(58) Field of Classification Search
CPC ............... H04R 2201/003; H04R 7/06; H04R 2410/00; B81B 3/0021; B81B 2201/0257; B81C 1/00158
See application file for complete search history.

(56) References Cited

U.S. PATENT DOCUMENTS

| | | | | |
|---|---|---|---|---|
| 9,686,619 | B2* | 6/2017 | Zinn | .................. B81C 1/00309 |
| 2014/0084396 | A1* | 3/2014 | Jenkins | ............... B81C 1/00158 |
| | | | | 257/419 |
| 2015/0078592 | A1 | 3/2015 | Uchida | |
| 2018/0002168 | A1* | 1/2018 | Cargill | ................ B81C 1/00182 |
| 2019/0394573 | A1* | 12/2019 | Cheng | .................. H04R 19/005 |
| 2020/0100034 | A1* | 3/2020 | Zhang | .................. H04R 19/005 |

FOREIGN PATENT DOCUMENTS

| | | |
|---|---|---|
| CN | 104469578 | 3/2015 |
| CN | 104541521 | 4/2015 |
| CN | 205283816 | 6/2016 |
| CN | 107211223 | 9/2017 |
| CN | 206533541 | 9/2017 |
| CN | 206908856 | 1/2018 |
| CN | 207070353 | 3/2018 |
| CN | 207124764 | 3/2018 |
| CN | 110351641 | 10/2019 |
| CN | 110574397 | 12/2019 |

OTHER PUBLICATIONS

"Office Action of China Counterpart Application", dated Jan. 13, 2022, p. 1-p. 8.

* cited by examiner

STRUCTURE OF MICRO-ELECTRO-MECHANICAL-SYSTEM MICROPHONE

BACKGROUND

1. Field of the Invention

The invention is related to semiconductor fabrication, and particularly related to the structure of micro-electro-mechanical-system (MEMS) microphone.

2. Description of Related Art

Microphone has been designed based on semiconductor fabrication technology, so as to greatly reduce the size. The MEMS microphone is a popular device used in electronic apparatus to sense acoustic signals, such as the communication voice.

The function of the MEMS microphone to sense the acoustic signal is based on a diaphragm, which is responding to the air pressure from the acoustic signal with a frequency, so to vibrate corresponding to the frequency and amplitude of the acoustic signal. The acoustic signal is then converted into electric signal for subsequent application in peripheral electronic apparatus.

The diaphragm of the MEMS microphone is flexible so to respond the air pressure. In this situation, if the diaphragm of the MEMS microphone receives a sudden over-high pressure, the diaphragm may be damaged. The balance for the sudden air pressure on the diaphragm is still an issue to solve.

How to design diaphragm of the MEMS microphone is still under developing in the art.

SUMMARY OF THE INVENTION

The invention provides a structure of MEMS microphone. The diaphragm of the MEMS microphone is designed with an air valve structure so to be able to balance the sudden air pressure. The diaphragm may be further protected.

In an embodiment, the invention provides a structure of MEMS microphone includes a substrate of semiconductor, having a first opening in the substrate. A dielectric layer is disposed on the substrate, having a dielectric opening. A diaphragm is within the dielectric opening and held by the dielectric layer at a peripheral region, wherein the diaphragm has a diaphragm opening. A back-plate is disposed on the dielectric layer, over the diaphragm. A protruding structure is disposed on the back-plate, protruding toward the diaphragm. At least one air valve plate is affixed on an end of the protruding structure within the diaphragm opening of the diaphragm. The air valve plate is activated when suffering an air flow with a pressure.

In an embodiment, the invention also provides a structure of MEMS microphone, comprising a substrate, a dielectric layer on the substrate and a back-plate on the dielectric layer. The diaphragm comprises a sensing part held by a dielectric layer to respond a pressure variance from acoustic signal, wherein the sensing part comprises at least a diaphragm opening. At least one air valve plate is disposed within the diaphragm opening at a same height of the sensing part. The air valve plate with a spring part is activated when suffering an air flow other than the acoustic signal.

In embodiment, as to the structure of MEMS microphone, the air valve plate comprises: a base plate affixed to the back-plate; a swayable plate; and a spring joint, connected between the base plate and the swayable plate. The swayable plate vibrates in response to the pressure of the air flow.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The invention is directed to a structure of MEMS microphone. The MEMS microphone has the diaphragm with air valve plate for protection from sudden air pressure.

The invention provides a plurality of embodiments for descriptions but the invention is not limited to the embodiments as provided. Further, a suitable combination among the embodiments may be made.

The diaphragm of the MEMS microphone is used to sense the variance of the air pressure from the acoustic signal in amplitude and frequency. To have the sensitivity to the acoustic signal, the diaphragm is rather flexible and may be over bent. In this situation, the mechanical strength may be not sufficiently strong to resist a sudden air pressure, in which the amplitude is over large to drive the diaphragm. The diaphragm may be damaged due to this sudden over-high air pressure.

The invention proposes the air valve plates that are implemented with the diaphragm to release the sudden air pressure while the air flow, usually unexpected other than the actual acoustic signals is received by the MEMS microphone.

Figure 1:
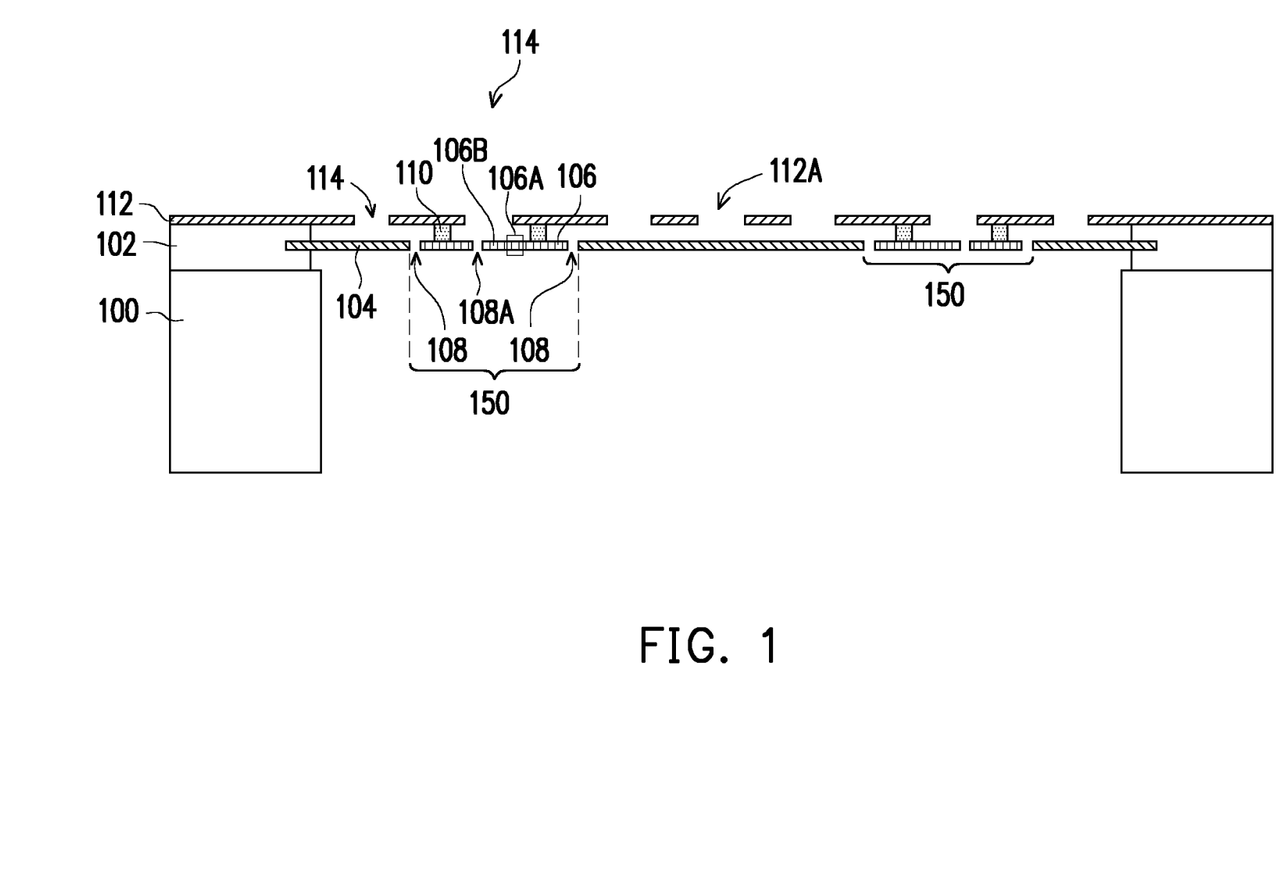
FIG. 1 is a drawing, schematically illustrating a cross-sectional view of a structure of MEMS microphone, according to an embodiment of the invention.
Figure 2:
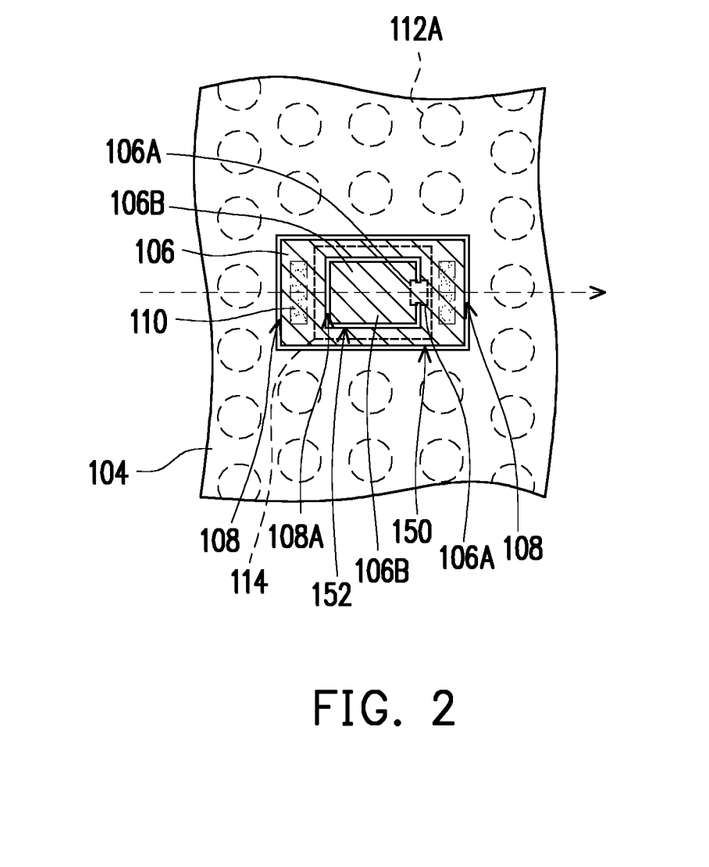
FIG. 2 is a drawing, schematically illustrating a perspective top view of a portion of the MEMS microphone, according to an embodiment of the invention.

FIG. 1 is a drawing, schematically illustrating a cross-sectional view of a structure of MEMS microphone, according to an embodiment of the invention. FIG. 2 is a drawing, schematically illustrating a perspective top view of a portion of the MEMS microphone, according to an embodiment of Referring to FIG. 1 and also FIG. 2, a substrate 100, such as silicon substrate, is provided as a structure base. A dielectric layer 102 is disposed on the substrate 100. A diaphragm 104 is held by the dielectric layer 102 at the peripheral region. The substrate has an opening and the dielectric layer 102 has also a dielectric opening corresponding to the opening of the substrate 100, together as an integrated opening. The diaphragm 104 is released by the dielectric opening and then the central sensing portion of the diaphragm 104 is exposed. The diaphragm 104 has an opening 150, which is reserved for forming an air valve plate 160 within the opening 150 of the diaphragm 104.

In an embodiment, the air valve plate 160 may be the same material of the diaphragm 104 in the same patterning process. In an embodiment, the diaphragm 104 may be a single layer or a stacked layer of multiple materials, depending on how the diaphragm 104 is actually formed. However, the air valve plate 160 is patterned to be separate from the diaphragm 104, locally disposed within the opening 150. The number of air valve plate 160 may be one or more. The detail structure would be further described later.

The air valve plate 160 is affixed to the dielectric layer 102 by a protruding structure 110, in which the back-plate 112 is disposed on the dielectric layer 102 to provide protection and an electrode plate. The protruding structure 110 is between the back-plate 112 and the air valve plate 160, so that the air valve plate 160 is affixed to dielectric layer 102. The back-plate 112 has venting holes 112A and venting holes 114. The venting holes 114 are corresponding to the air valve plate 160.

The structure of the air valve plate 160 cross-section view as seen in FIG. 1 at and the plane view as seen in FIG. 2 includes a base part, which is firmly affixed to the back-plate 112 through the protruding structure 110. In an embodiment, the air valve plate 160 also includes a spring joint 106A and a swayable plate 106B. The spring joint 106A connects between the base part and the swayable plate 106B. Due to the spring effect from the spring joint 106A, the swayable plate can be sway in responding to the air flow through at the opening 150 of the diaphragm 102 and further through the venting hole 114. The air valve plate 160 within the opening 150 of the diaphragm 102 has a slit 108 to the diaphragm 102.

In an embodiment, the base part of the air valve plate 106 is a ring-like structure having an opening 152, as seen in FIG. 2. The opening 152 is adapting the swayable plate 106B, in which a slit 108A is between the swayable plate 106B and the base part of the air valve plate 160. The operation mechanism in an example would be described later in FIG. 4 to FIG. 6C.

In an embodiment, the base part of the air valve plate 160 is ring-like structure. To hold the base part of the air valve plate 160, in embodiments, the protruding structure 110 may be a single part, multiple parts, or a ring-like structure corresponding to the ring-like structure of the base part of the air valve plate 106 but the invention is not just limited to the multiple embodiments. In an example to FIG. 2, the protruding structure 100 has two parts distributed along at two sides of the base part of the air valve plate 160, so to firmly fix the air valve plate 160, while the swayable plate 106B may sway in response to the air pressure of the sudden air flow in an example. As noted, the slit 108 and slit 108A in an example may be just like a cut portion of the diaphragm 104 during fabrication. The slits 108, 108A may be narrow, so that the diaphragm 104 may receive the acoustic signal, normally without much leaking air. The air valve plate 106 is activated when suffering an air flow with a pressure, which sufficiently large to sway the swayable plate 106B depending on the elastic strength of the spring joint 106A. However, the invention is not just limited to the embodiments. As also noted, the geometric shape of the ring-like structure for the base part of the air valve plate 106 is not limited to the rectangular. It may be a round shape or any suitable shape to adapt the swayable plate 106B.

Figure 3:
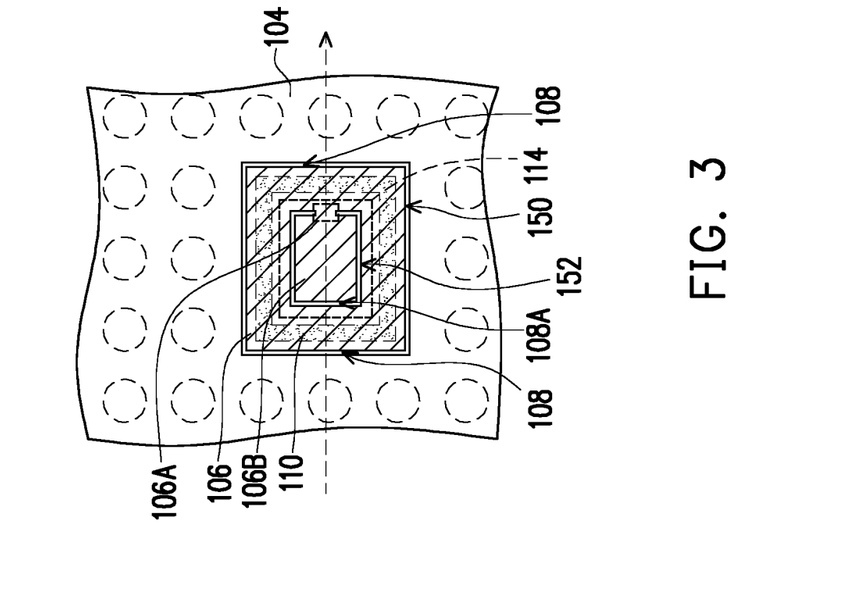
FIG. 3 is a drawing, schematically illustrating a perspective top view of a portion of the MEMS microphone, according to an embodiment of the invention.

FIG. 3 is a drawing, schematically illustrating a perspective top view of a portion of the MEMS microphone, according to an embodiment of the invention. Referring to FIG. 3, it is similar to the structure of FIG. 2 but the protruding structure 110 is modified into a ring-like structure. In this embodiment, the protruding structure 110 corresponding to the base part of the air valve plate 106 and surrounds the swayable plate 106B of the air valve plate 106.

Figure 4:
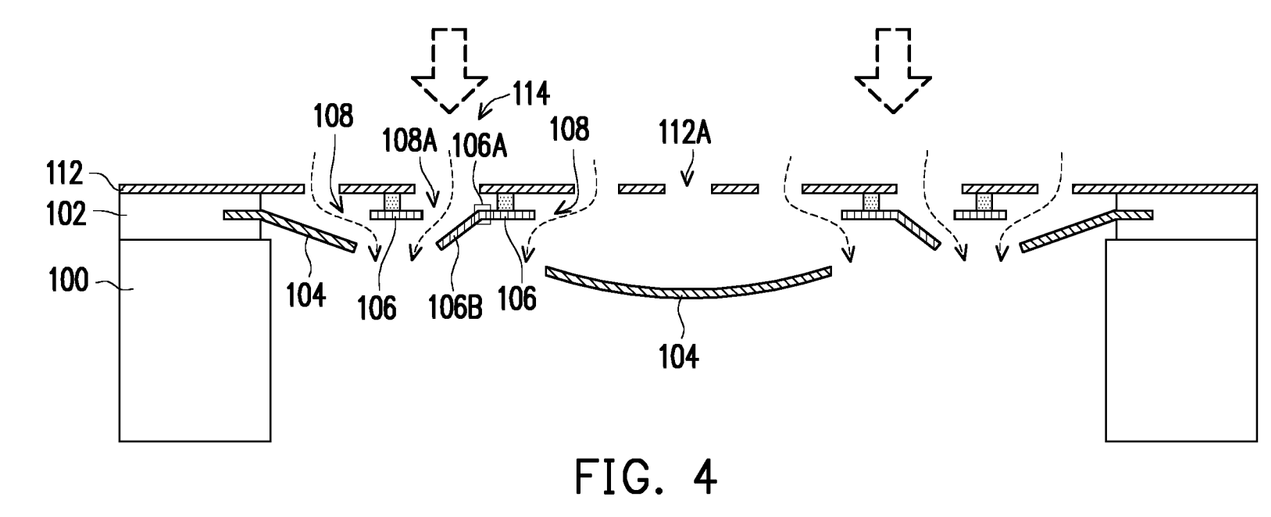
FIG. 4 is a drawing, schematically illustrating a cross-section view of a MEMS microphone in operation state, according to an embodiment of the invention.

Base on the air valve plate 106 of the invention in the embodiments, the air releasing mechanism is further described. FIG. 4 is a drawing, schematically illustrating a cross-section view of a MEMS microphone in operation state, according to an embodiment of the invention.

Referring to FIG. 4, when the sudden air flow, as schematically shown by the thick arrows, enters the back-plate 112 of the MEMS microphone. The air flow may enter the venting holes 112A and the venting holes 114. The venting holes 112A basically are normally used to receive the acoustic signal and also provide a pressure balance for the diaphragm 104 during operation. The air flow, other than the acoustic signals in an example, may still enter the venting holes 112A and reach to the diaphragm 104, in which the diaphragm 104 suffers the air flow and is bent accordingly. However, a portion of the air flow may enter the venting hole 114 and reach to the air valve plate 106.

In this situation, the air flow entering the venting hole 114 of the back-plate 112 would activate the air valve plate 106, in which the swayable plate 106B is bent due to the spring joint 106A, which connects with the base part of the air valve plate 106. The base part is affixed to the protruding structure 110 at the back-plate 112. The slit 108 and the slit 108A are open in large to allow the air flow to flow through, as shown by thin arrows. Usually, the peripheral region of diaphragm 104 is the fragile part and is easily damaged. The air valve plate 106 is implemented at the peripheral region to release the sire flow, particular to the sudden over-high air flow.

Figure 5:
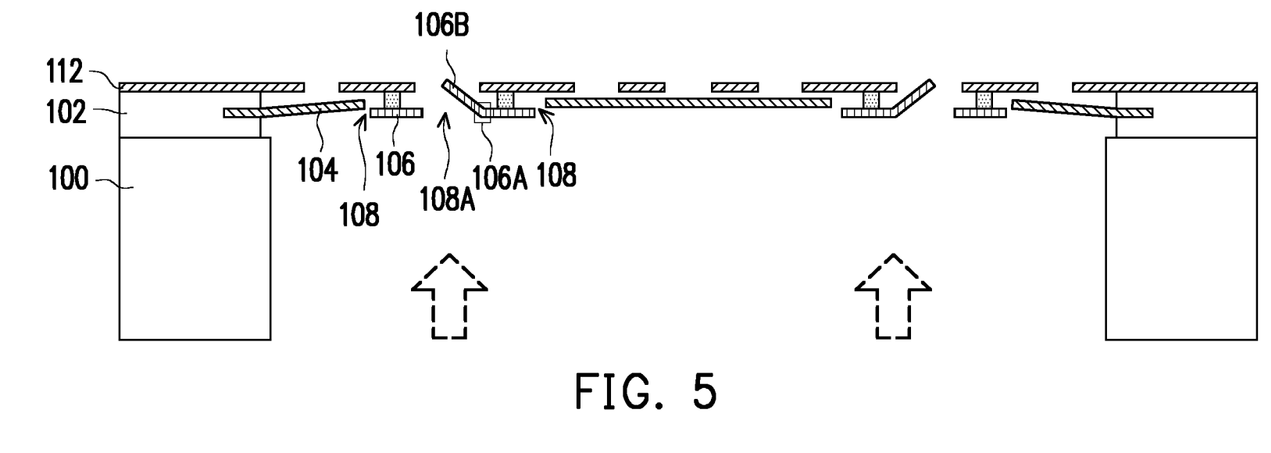
FIG. 5 is a drawing, schematically illustrating a cross-section view of a MEMS microphone in operation state, according to an embodiment of the invention.

FIG. 5 is a drawing, schematically illustrating a cross-section view of a MEMS microphone in operation state, according to an embodiment of the invention. Referring to FIG. 5, the air flow may enter from the opening of the substrate 100. The similar mechanism to FIG. 4 is activated. The slit 108 and the slit 108A are open in large to allow the air flow to flow through.

Figure 6A:
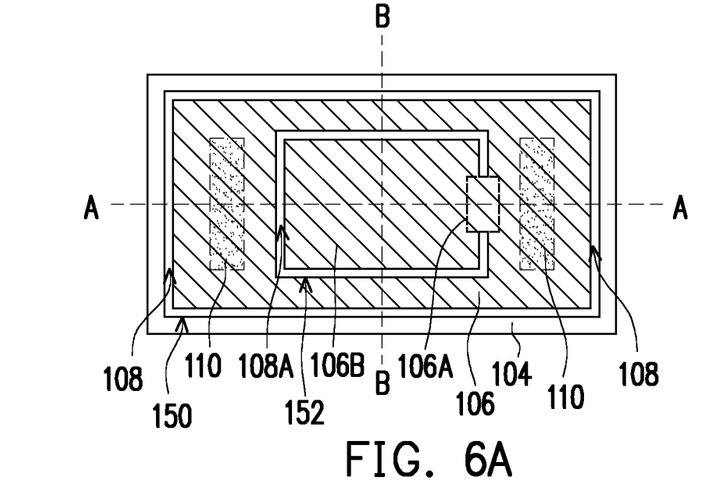
FIG. 6A to FIG. 6C are drawing, schematically illustrating the protection mechanism of the air valve plate, according to an embodiment of the invention.
Figure 6B:
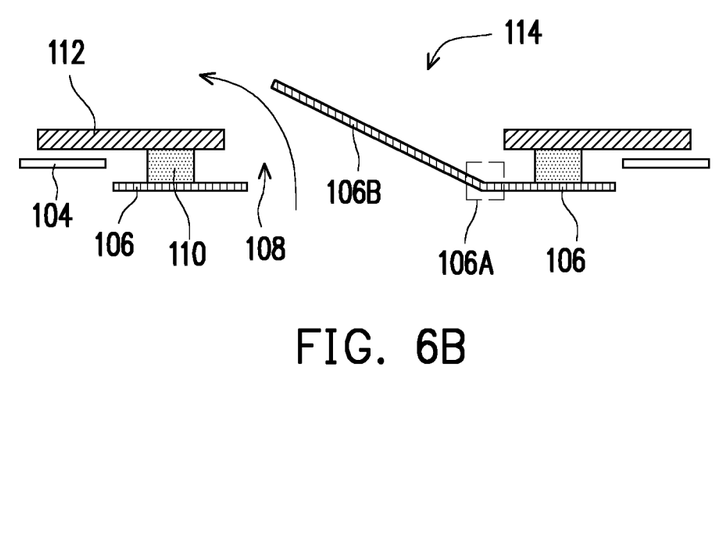
Figure 6C:
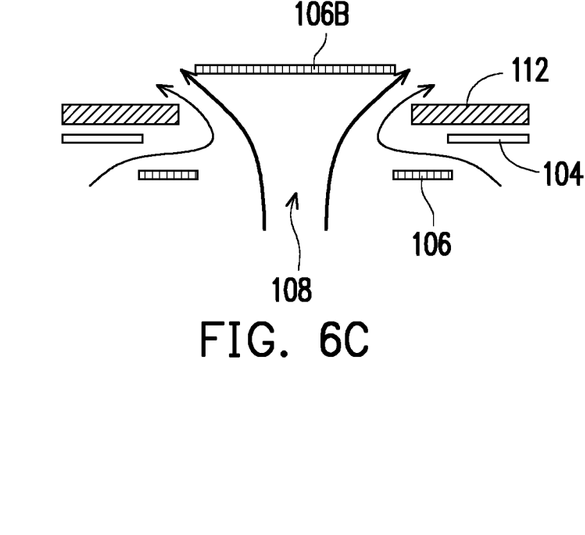

FIG. 6A to FIG. 6C are drawing, schematically illustrating the protection mechanism of the air valve plate, according to an embodiment of the invention. Referring to FIG. 6A, FIG. 6B and FIG. 6C, as also described in FIG. 5, the detail of the swayable plate in responding to the air flow is described. Taking the air flow from the substrate as an example, the cross-section status of the air valve plate 106 is along the line AA in FIG. 6A. As seen in FIG. 6B, the base part of the air valve plate 106 is affixed to the back-plate 112 through the protruding structure 110, so that the base part basically is not moved by the air flow. The air flow reaches to the swayable plater 106B of the air valve plate 106. The air valve plate 106 is swayed up due to the spring joint 106A. The slip 108 is open in large, so that a portion of the air flow with respect to the air valve plate 106 may flow through. The pressure of the diaphragm 104 in suffering the air flow may be reduced due to the air valve plate 106.

As further referring to FIG. 6C, the status of the air valve plate 106 along the line BB in FIG. 6A is shown. The swayable plater 106B is lifted up, so that the slit 108 is effectively open in large, to release the air flow.

Figure 7:
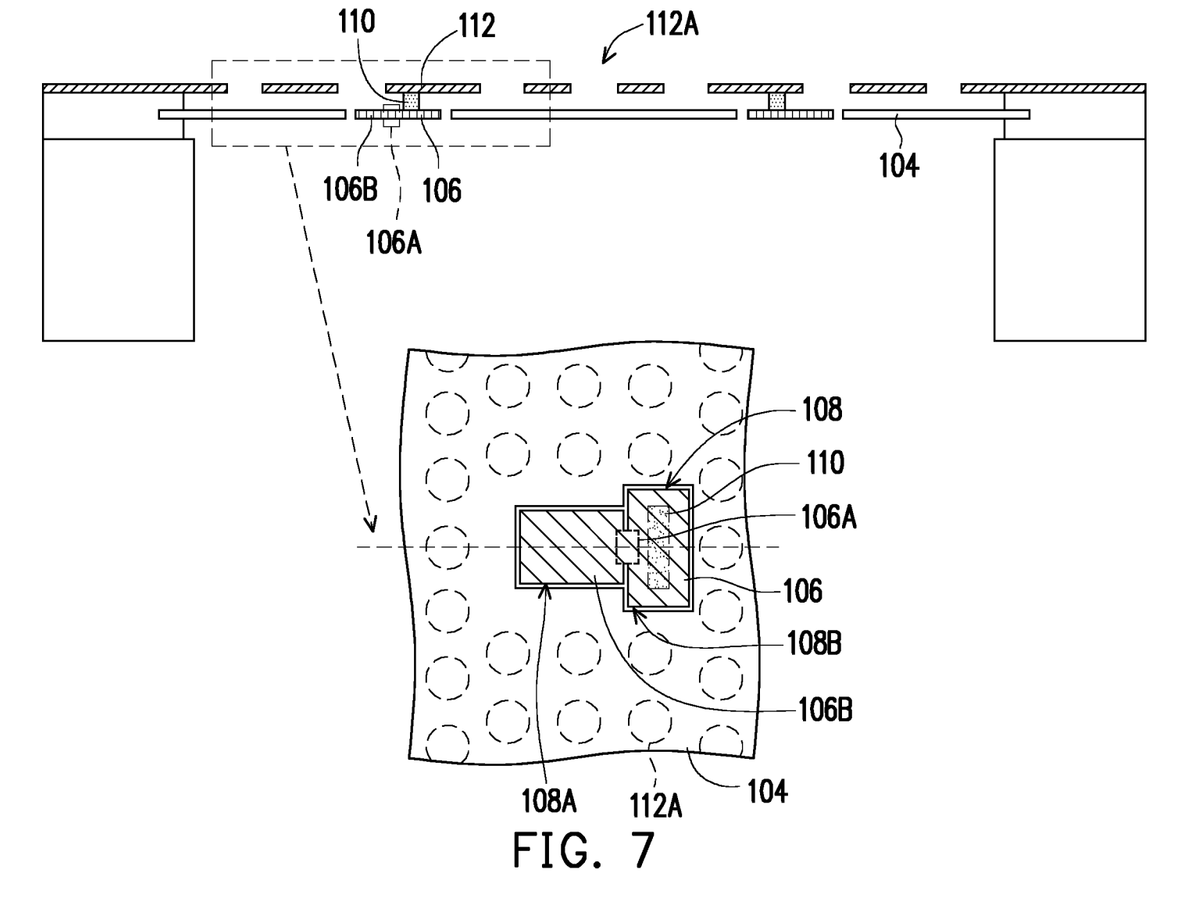
FIG. 7 is a drawing, schematically illustrating a cross-sectional view and a sectional top view of a MEMS microphone, according to an embodiment of the invention.

FIG. 7 is a drawing, schematically illustrating a cross-sectional view and a sectional top view of a MEMS microphone, according to an embodiment of the invention. Referring to FIG. 7, the upper part of the drawing is the cross-section structure of the MEMS microphone. The lower part of the drawing is a plane view of the air valve plater 106 according to another embodiment.

The air valve plater 106 in embodiment may be formed by two pieces. One solid piece, without hollow and not the ring-like structure, is the base part, affixed to the protruding structure 110 and then to the back-plate 112. Another piece is the swayable plate 106B, which is not surrounded by the base part. In an embodiment, the base part is a rectangular part as an example. The protruding structure 110 is also a single bar as an example to hold the base part of the air valve plater 106. The swayable plate 106B as another solid piece and is connected to the base part by the spring joint 106A. The spring mechanism is similar to the structure in FIG. 1 but the air valve plater 106 is further modified. The slit 108 surrounds the air valve plater 106. In addition, the slit 108A is a portion of the slit 108 surrounds the swayable plate 106B. In the embodiment, the slit 108 also includes a portion as the slit 108B, which surrounds the base part of the air valve plater 106. In the embodiment, the two solid pieces of the air valve plater 106 are connected by the spring joint 106B. Here, the solid piece in an example is a piece without hollow portion therein, not the ring-like structure. In this example, the protruding structure 110 may be a single part or multiple parts as well. However, the ring-like structure of the protruding structure 110 may be not excluded, in which the ring-like structure mat still support the base part of the air valve plater 106.

It is further noted that the slit 108 includes a portion at the waist of the air valve plater 106, corresponding to the spring joint 106B for dividing the swayable plate 106B and the base part.

In fabrication, the air valve plate 106 and the diaphragm 104 in an embodiment may be the material layer and be formed in the same patterning process. However, the invention is not limited to a specific method to form the air valve plate 106.

Figure 8A:
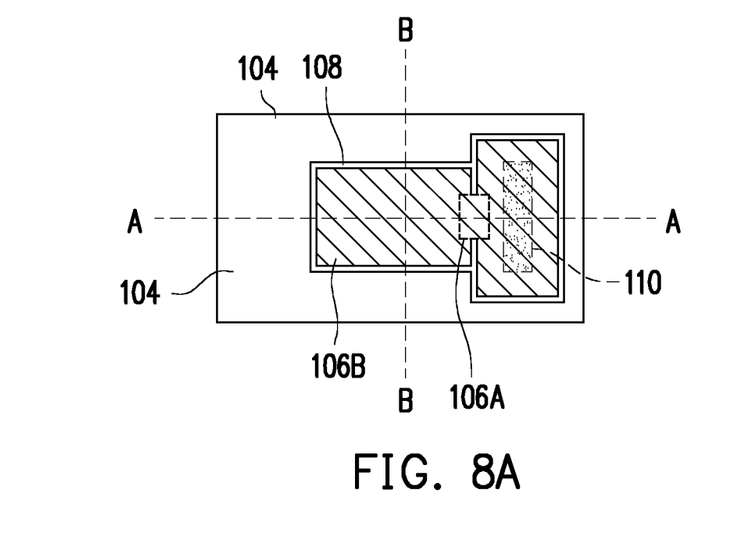
FIG. 8A to FIG. 8C are drawing, schematically illustrating the protection mechanism of the air valve plate, according to an embodiment of the invention.
Figure 8B:
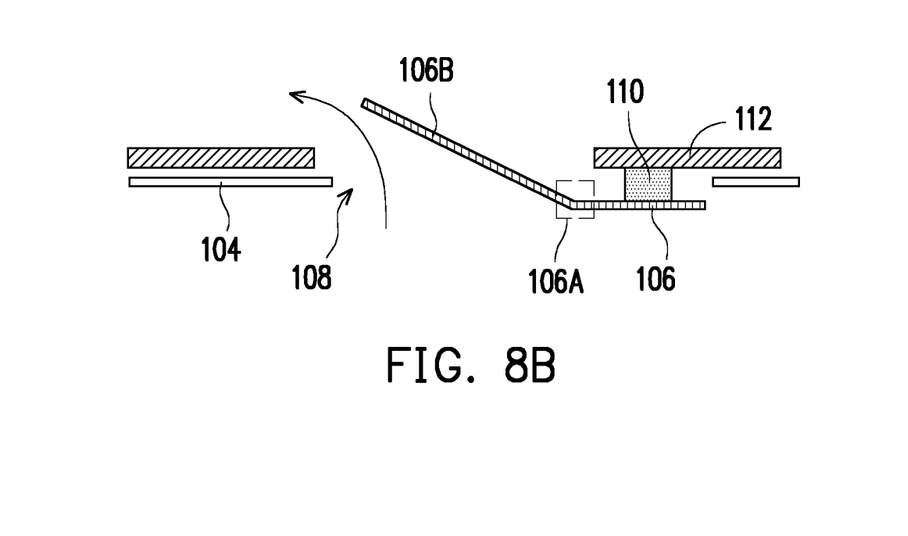
Figure 8C:
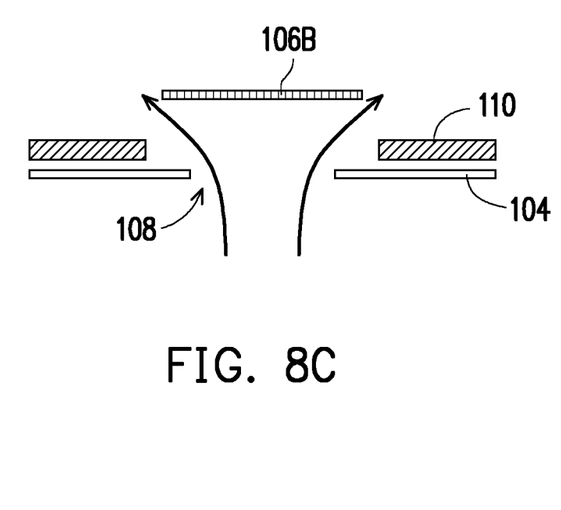

FIG. 8A to FIG. 8C are drawing, schematically illustrating the protection mechanism of the air valve plate, according to an embodiment of the invention. Referring to FIG. 8A to FIG. 8C, the structure in FIG. 8B is a cross-section structure cutting along the line AA in FIG. 8A and the structure in FIG. 8C is a cross-section structure cutting along the line BB in FIG. 8A. Similar to FIG. 6A to FIG. 6C, the air flow may be efficiently released through the slit 180. In other words, the air valve plate 106 may be modified in various ways but the air valve plate 106 is affixed to the back-plate without moving with the diaphragm 104. The efficiency to release the air flow may be improved.

As to the foregoing descriptions, the invention provides a structure of MEMS microphone includes a substrate of semiconductor, having a first opening in the substrate. A dielectric layer is disposed on the substrate, having a dielectric opening. A diaphragm is within the dielectric opening and held by the dielectric layer at a peripheral region, wherein the diaphragm has a diaphragm opening. A back-plate is disposed on the dielectric layer, over the diaphragm.

A protruding structure is disposed on the back-plate, protruding toward the diaphragm. At least one air valve plate is affixed on an end of the protruding structure within the diaphragm opening of the diaphragm. The air valve plate is activated when suffering an air flow with a pressure.

In an embodiment, as to the MEMS microphone, the protruding structure comprises a single local part, a plurality of local parts, or a closing ring-like part to support the base plate of the air valve plate.

In an embodiment, as to the MEMS microphone, the air valve plate comprises: a base plate affixed to the protruding structure; a swayable plate; and a spring joint connected between the base plate and the swayable plate, wherein the swayable plate vibrates in response to the pressure of the air flow.

In an embodiment, as to the MEMS microphone, the base plate is a ring-like structure having an opening and the swayable plate is located within the opening and connected to the base plate by the spring joint.

In an embodiment, as to the MEMS microphone, the protruding structure comprises a single local part, a plurality of local parts, or a ring-like part to support the base plate of the air valve plate.

In an embodiment, as to the MEMS microphone, a geometric shape of the diaphragm opening is conformal to a periphery of the base plate.

In an embodiment, as to the MEMS microphone, the air valve plate has a slit between the ring-like structure and the swayable plate.

In an embodiment, as to the MEMS microphone, the base plate is a first solid piece and the swayable plate is a second solid piece, wherein the spring joint connects the first solid piece and the second solid piece.

In an embodiment, as to the MEMS microphone, the protruding structure comprises at least one local part to support the base plate of the air valve plate.

In an embodiment, as to the MEMS microphone, a geometric shape of the diaphragm opening is conformal to an integrated periphery of the first solid piece and the second solid piece.

In an embodiment, as to the MEMS microphone, the air valve plate has a slit to enclose an inner portion of the air valve plate, wherein the slit has disconnection portion to serve a spring effect to allow the inner portion to be swayable in response to the pressure of the air flow.

In an embodiment, as to the MEMS microphone, the air valve plate has a slit as a waist to define into a first piece and a second piece, wherein the first piece is affixed to the protruding structure.

In an embodiment, as to the MEMS microphone, a plurality of the air valve plates is distributed at a peripheral region of the diaphragm.

In an embodiment, the invention also provides a structure of MEMS microphone, comprising a substrate, a dielectric layer on the substrate and a back-plate on the dielectric layer. The diaphragm comprises a sensing part held by a dielectric layer to respond a pressure variance from acoustic signal, wherein the sensing part comprises at least a diaphragm opening. At least one air valve plate is disposed within the diaphragm opening at a same height of the sensing part. The air valve plate with a spring part is activated when suffering an air flow other than the acoustic signal.

In an embodiment, as to the MEMS microphone, the air valve plate comprises: a base plate affixed to the back-plate; a swayable plate; and a spring joint connected between the base plate and the swayable plate, wherein the swayable plate vibrates in response to the pressure of the air flow.

In an embodiment, as to the MEMS microphone, the air valve plate has a slit to enclose an inner portion of the air valve plate, wherein the slit has disconnection portion to serve a spring effect to allow the inner portion to be swayable in responding to the air flow.

In an embodiment, as to the MEMS microphone, the air valve plate has a slit to form a waist part so to define into a first piece and a second piece joined at the waist part, wherein the first piece is affixed to the back-plate.

In an embodiment, as to the MEMS microphone, a plurality of the air valve plates is distributed at a peripheral region of the diaphragm.

It will be apparent to those skilled in the art that various modifications and variations may be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A structure of micro-electro-mechanical-system (MEMS) microphone, comprising:
   a substrate of semiconductor, having a first opening in the substrate;
   a dielectric layer, disposed on the substrate, having a dielectric opening;
   a diaphragm, within the dielectric opening and held by the dielectric layer at a peripheral region, wherein the diaphragm has a diaphragm opening;
   a back-plate, disposed on the dielectric layer, over the diaphragm;
   a protruding structure, disposed on the back-plate, protruding toward the diaphragm; and
   at least one air valve plate, affixed on an end of the protruding structure within the diaphragm opening of the diaphragm, wherein the air valve plate is activated when suffering an air flow with a pressure.

2. The structure of MEMS microphone as recited in claim 1, wherein the protruding structure comprises a single local part, a plurality of local parts, or a closing ring-like part to support the base plate of the air valve plate.

3. The structure of MEMS microphone as recited in claim 1, wherein the air valve plate comprises:
   a base plate affixed to the protruding structure;
   a swayable plate; and
   a spring joint, connected between the base plate and the swayable plate, wherein the swayable plate vibrates in response to the pressure of the air flow.

4. The structure of MEMS microphone as recited in claim 3, wherein the base plate is a ring-like structure having an opening and the swayable plate is located within the opening and connected to the base plate by the spring joint.

5. The structure of MEMS microphone as recited in claim 4, wherein the protruding structure comprises a single local part, a plurality of local parts, or a ring-like part to support the base plate of the air valve plate.

6. The structure of MEMS microphone as recited in claim 5, wherein a geometric shape of the diaphragm opening is conformal to a periphery of the base plate.

7. The structure of MEMS microphone as recited in claim 5, wherein the air valve plate has a slit between the ring-like structure and the swayable plate.

8. The structure of MEMS microphone as recited in claim 4, wherein the base plate is a first solid piece and the swayable plate is a second solid piece, wherein the spring joint connects the first solid piece and the second solid piece.

9. The structure of MEMS microphone as recited in claim 8, wherein the protruding structure comprises at least one local part to support the base plate of the air valve plate.

10. The structure of MEMS microphone as recited in claim 8, wherein a geometric shape of the diaphragm opening is conformal an integrated periphery of the first solid piece and the second solid piece.

11. The structure of MEMS microphone as recited in claim 1, wherein the air valve plate has a slit to enclose an inner portion of the air valve plate, wherein the slit has disconnection portion to serve a spring effect to allow the inner portion to be swayable in response to the pressure of the air flow.

12. The structure of MEMS microphone as recited in claim 1, wherein the air valve plate has a slit as a waist to define into a first piece and a second piece, wherein the first piece is affixed to the protruding structure.

13. The structure of MEMS microphone as recited in claim 1, wherein a plurality of the air valve plates is distributed at a peripheral region of the diaphragm.

14. A structure of micro-electro-mechanical-system (MEMS) microphone, comprising a substrate, a dielectric layer on the substrate, a diaphragm, and a back-plate on the dielectric layer, wherein the diaphragm comprises:
   a sensing part held by a dielectric layer to respond a pressure variance from an acoustic signal, wherein the sensing part comprises at least a diaphragm opening; and
   at least one air valve plate, disposed within the diaphragm opening at a same height of the sensing part, wherein the air valve plate comprises:
   a base plate affixed to the back-plate;
   a swayable plate; and
   a spring joint connected between the base plate and the swayable plate,
   wherein the air valve plate with the spring joint is activated when suffering an air flow other than the acoustic signal, and the swayable plate vibrates in response to a pressure of the air flow.

15. The structure of MEMS microphone as recited in claim 14, wherein the air valve plate has a slit to enclose an inner portion of the air valve plate, wherein the slit has disconnection portion to serve a spring effect to allow the inner portion to be swayable in responding to the air flow.

16. The structure of MEMS microphone as recited in claim 14, wherein the air valve plate has a slit to form a waist part so to define into a first piece and a second piece joined at the waist part, wherein the first piece is affixed to the back-plate.

17. The structure of MEMS microphone as recited in claim 14, wherein a plurality of the air valve plates is distributed at a peripheral region of the diaphragm.

* * * * *